United States Patent [19]

Kobayashi et al.

[11] Patent Number: 4,486,834
[45] Date of Patent: Dec. 4, 1984

[54] MULTI-COMPUTER SYSTEM HAVING DUAL COMMON MEMORY

[75] Inventors: Yoshiki Kobayashi; Hideo Maejima; Tadaaki Bandoh; Hiroaki Nakanishi, all of Hitachi, Japan

[73] Assignee: Hitachi, Ltd., Tokyo, Japan

[21] Appl. No.: 485,020

[22] Filed: Apr. 14, 1983

Related U.S. Application Data

[63] Continuation-in-part of Ser. No. 105,701, Dec. 20, 1979, abandoned, which is a continuation-in-part of Ser. No. 783,735, Apr. 1, 1977, abandoned.

[30] Foreign Application Priority Data

Apr. 9, 1976 [JP] Japan .................................. 51-39198

[51] Int. Cl.³ ........................ G06F 13/00; G11C 9/00
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 3,668,644 | 6/1972 | Looschen | 364/200 |
| 3,676,851 | 7/1972 | Eastman | 364/200 |
| 3,866,182 | 2/1975 | Yamada et al. | 364/200 |
| 3,992,702 | 11/1976 | Balley | 364/200 |
| 4,228,496 | 10/1980 | Katzman et al. | 364/200 |

Primary Examiner—Gareth D. Shaw
Assistant Examiner—John G. Mills
Attorney, Agent, or Firm—Antonelli, Terry & Wands

[57] ABSTRACT

A multi-computer system having a dual common memory adapted to perform Read/Write operations by means of a plurality of computers. Each computer in the system consists of a central processing unit, a main memory and a dual memory access unit. The dual memory access unit is adapted to provide a status signal representative of whether the data from the common memory is correct or not and a maintenance signal representative of whether a maintenance operation is demanded. A memory access is made only to the common memory demanding the maintenance when the program run by the computer is a maintenance program, and only to the normal common memory during the usual operation.

7 Claims, 13 Drawing Figures

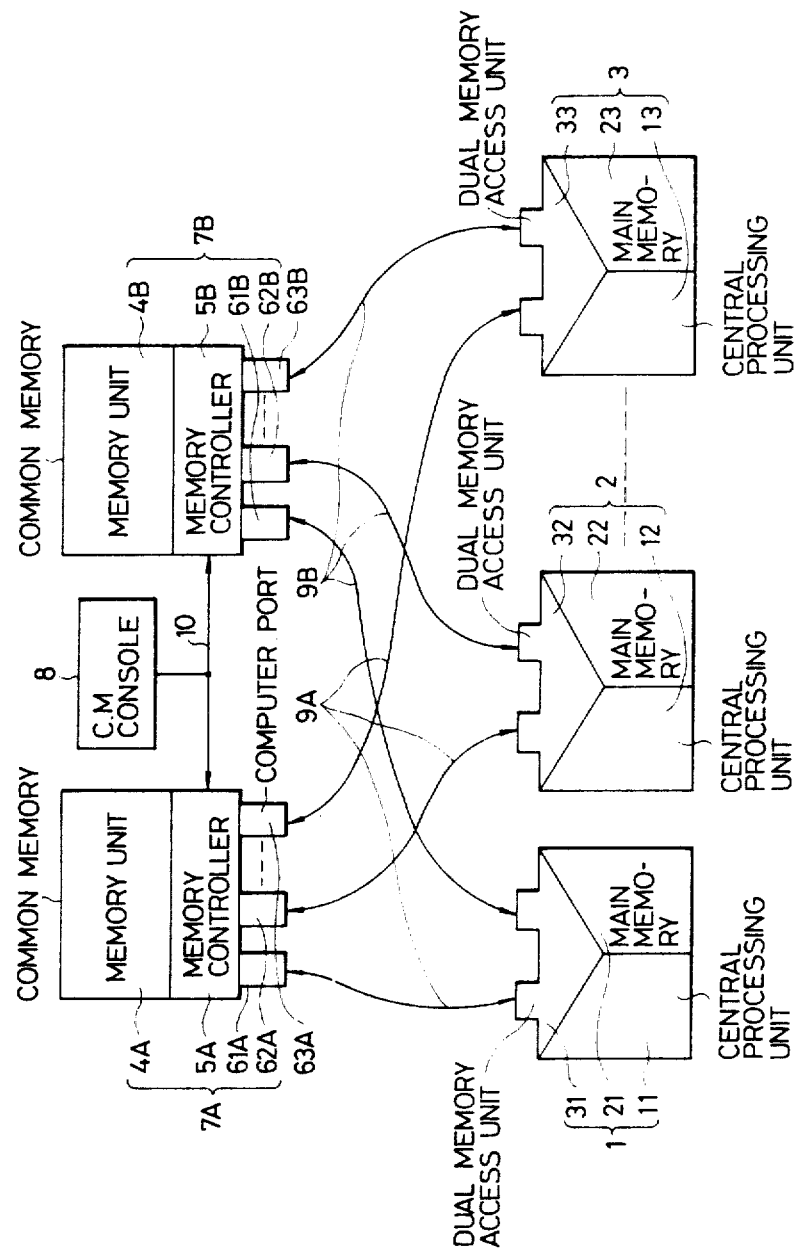

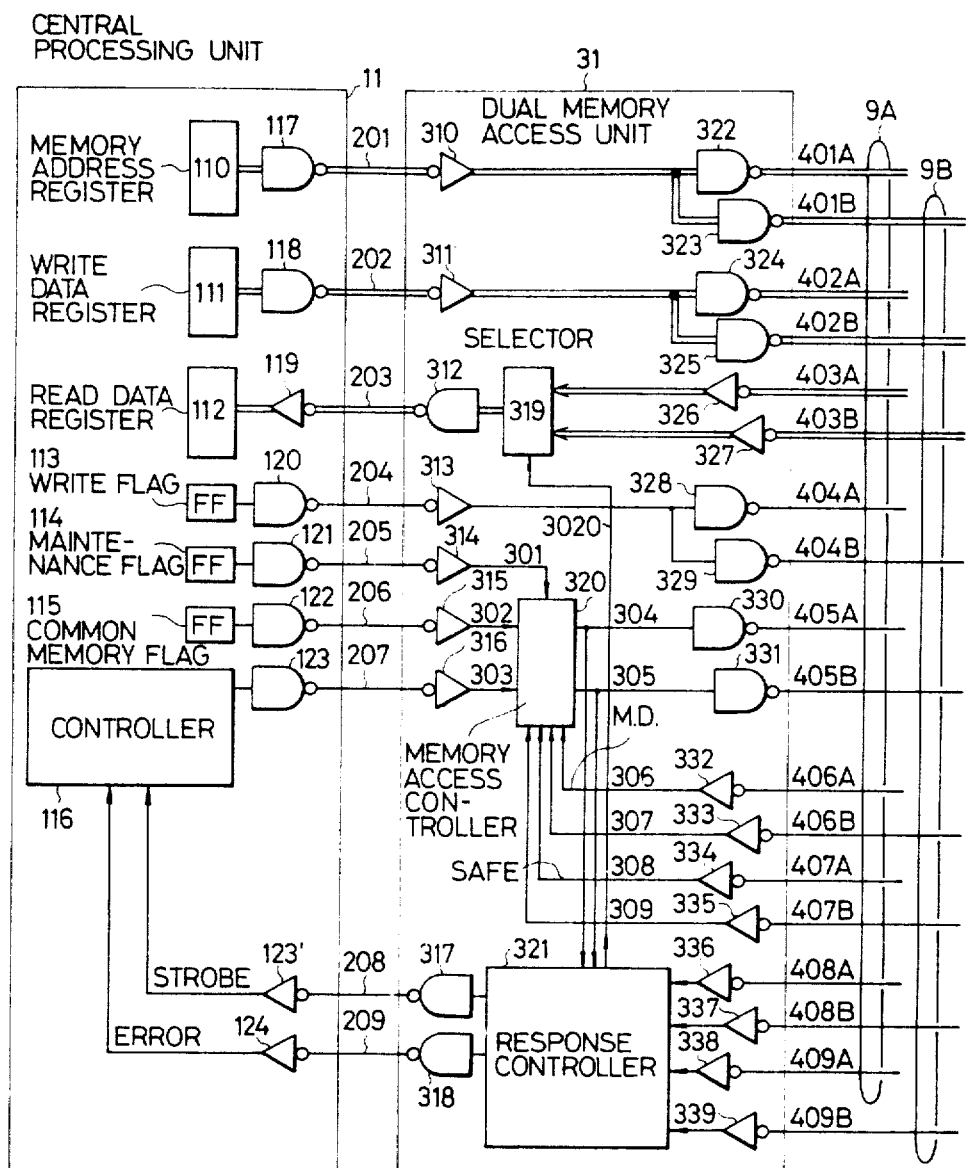
FIG. 2-A

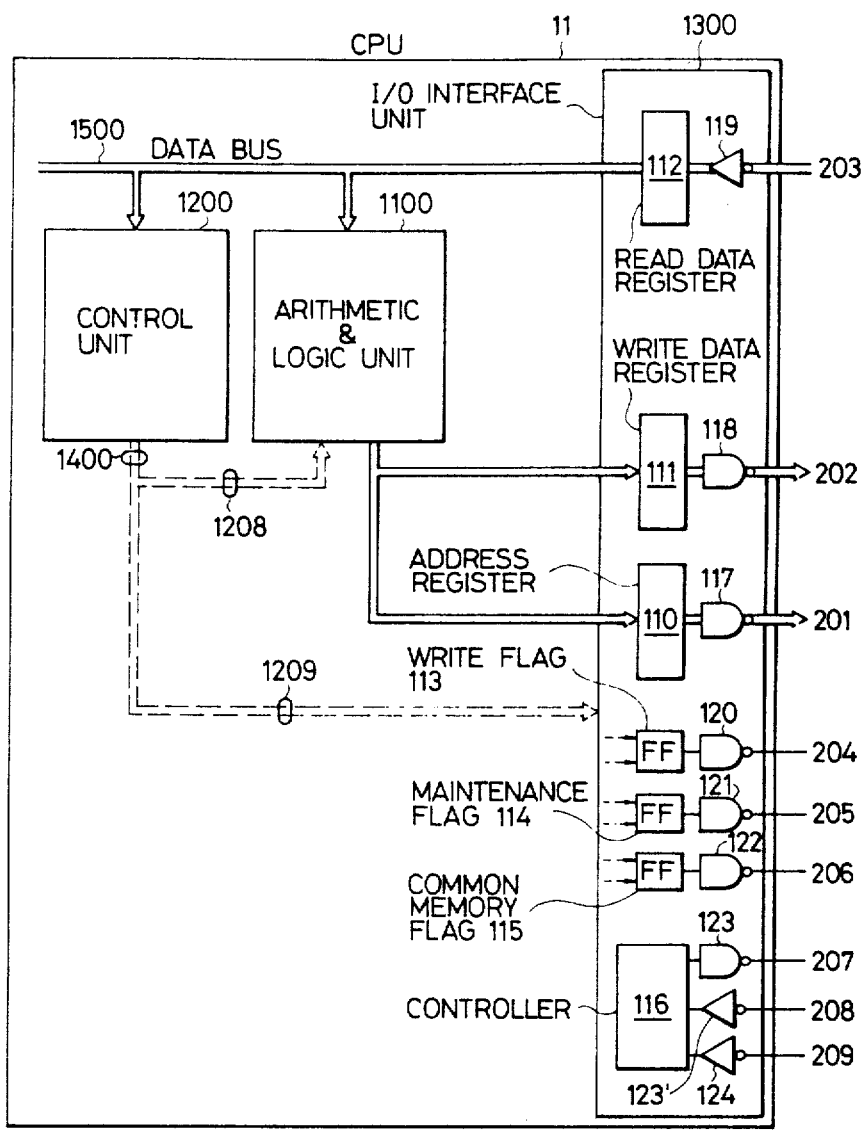
FIG. 2-B

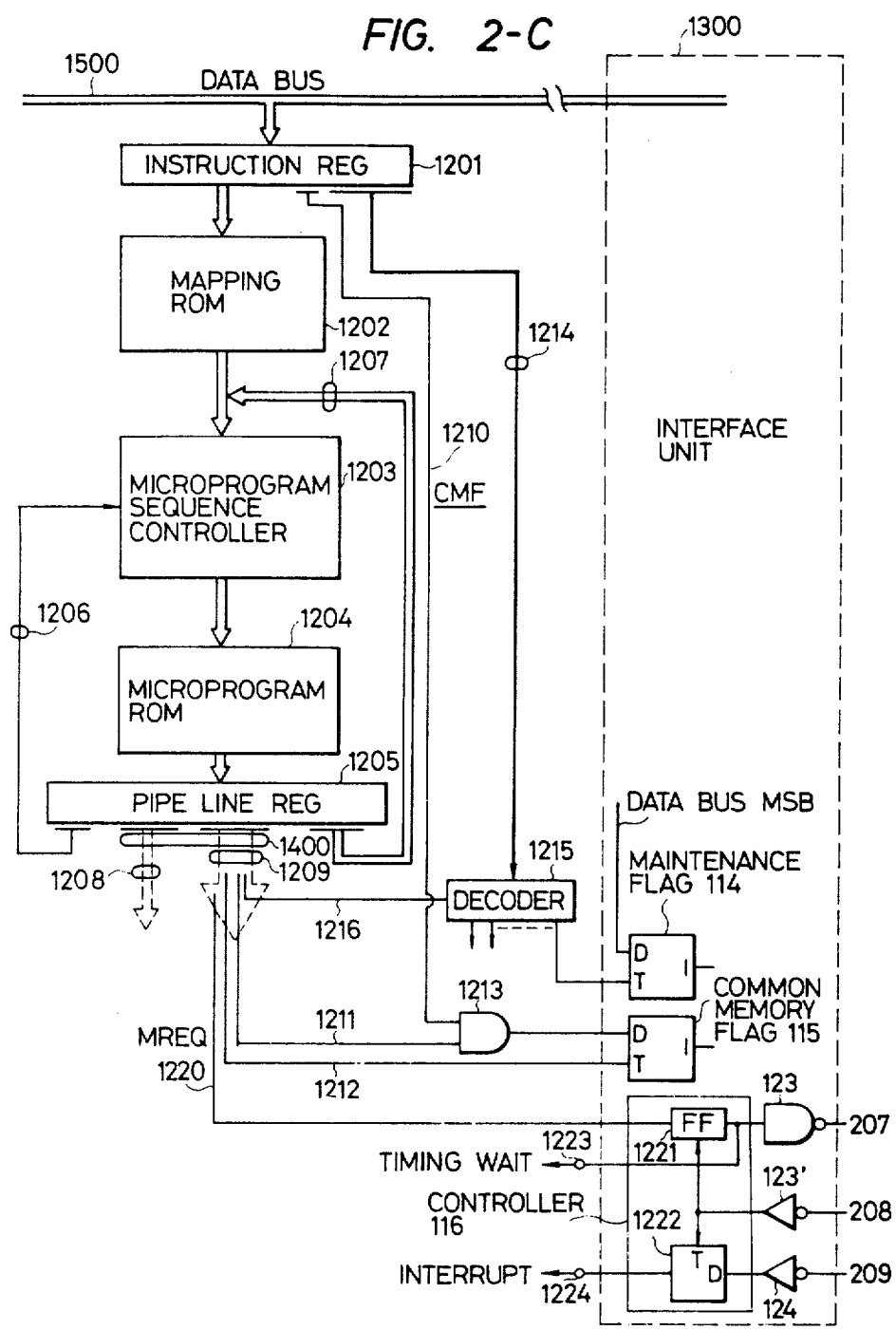
FIG. 2-C

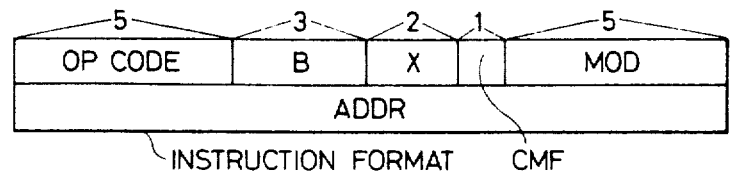
FIG. 2-D
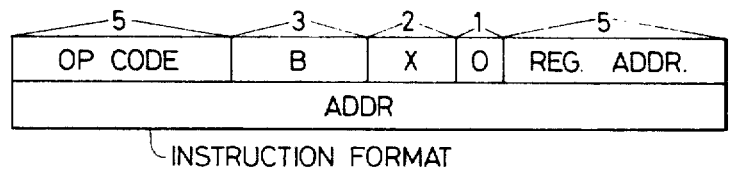
FIG. 2-E
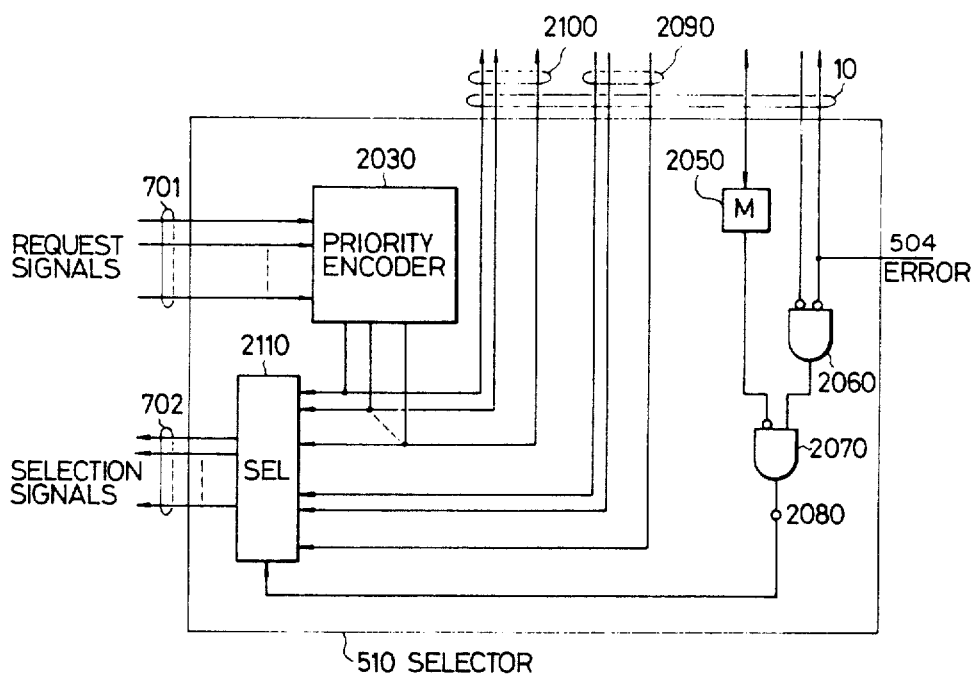
FIG. 4

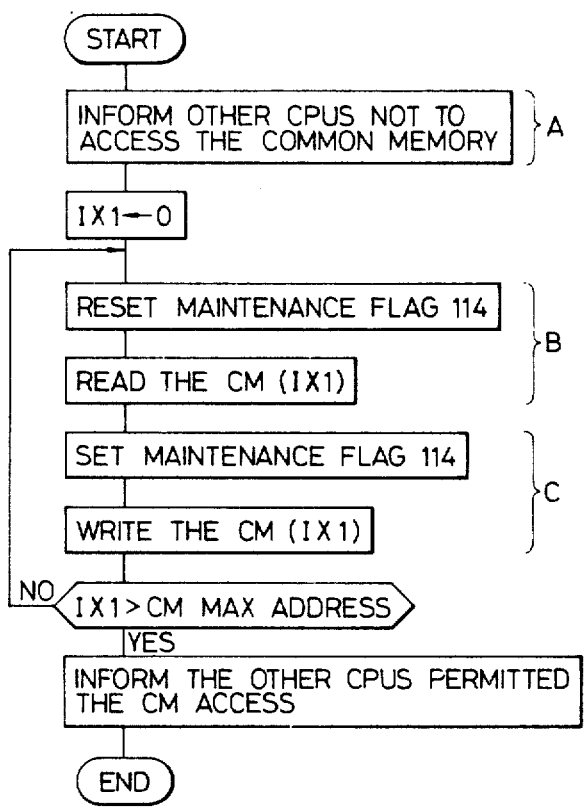

MULTI-COMPUTER SYSTEM HAVING DUAL COMMON MEMORY

FIELD OF THE INVENTION

This application is a continuation-in-part of our prior U.S. patent application Ser. No. 105,701, filed Dec. 20, 1979, now abandoned, which was a continuation-in-part of U.S. patent application Ser. No. 783,735, filed Apr. 1, 1977, also abandoned.

The present invention relates to a multi-computer system having a plurality of computers operatively associated with a dual common memory in which a Read/Write function is performed by one or more of the computers in the common memory. Generally speaking, in a conventional multi-computer system, a common memory accommodating a memory map list, an inter-processor communication area and a data storage area common to a plurality of processors is provided. This common memory constitutes a major or critical portion of the whole multi-computer system and, therefore, must be highly reliable, since any trouble with the common memory causes a failure of the whole system.

BACKGROUND OF THE INVENTION

One of the conventional methods for improving the reliability of a common memory, as well as the main memory of each individual computer, is to apply redundancy bits to the memories, thereby to detect errors and correct such errors by correcting the stored data. Although this method provides for an improvement in the reliability of the data stored in the memory by correcting an error of, for example, one bit, for this purpose, the system must be shut down for maintenance of the memory, which is undesirable.

Therefore, a dual arrangement of the common memory has become popular, especially in systems which cannot be shut down, as in the case of a multi-computer system designed for control purposes. In those systems having a dual common memory, the system is operated in the usual manner even when one of the memories becomes disabled so long as the other is working. Thus, the dual common memory as a whole is judged to have failed, only when both of the memories are out of order.

Therefore, for obtaining an improved reliability of the dual common memory, it is essential to shorten the time for repairing the failed memory, i.e., the maintenance time, as much as possible. According to the prior techniques, the failed memory is repaired in the off-line state, while separated from the system, thereby demanding a longer maintenance time, so that the reliability of the dual common memory is not sufficiently made use of. In addition, a specific apparatus or means performing this off-line maintenance must be provided. An on-line maintenance capability would solve these problems, but has not been previously provided.

One example of a system including a dual common memory is disclosed in U.S. Pat. No. 3,668,644, issued on June 6, 1972, entitled "Fail Safe Memory System" and assigned to Burroughs Corporation. However, in this system, there is no on-line maintenance capability for a failed memory module.

SUMMARY OF THE INVENTION

It is therefore an object of the invention to provide a single or multi-computer system having a dual common memory in which a failed memory unit can be checked by a computer program without separating it from the system.

It is another object of the invention to provide a single or multicomputer system having a dual common memory in which the reliability of the whole system is improved through shortening of the maintenance time for the dual common memory.

It is still another object of the invention to provide simple means which allow a dual memory access.

According to the invention, there is provided a system including a plurality of computers each of which consists of a processing unit, a main memory and a dual memory access unit, and two common memories each of which consists of a memory unit, a memory controller and a plurality of computer ports each corresponding to a respective one of the computers in the system, wherein the dual memory access unit of each computer is connected by interface to the corresponding computer port of each common memory.

In another aspect, the present invention provides a system in which a dual memory access unit is provided with a memory access controller, whereby the common memory to be accessed is determined upon receipt of a status signal representing whether the memory is normal, delivered from the common memory through the interface, a maintenance demand signal representing whether there is a demand for maintenance, delivered also from the common memory, as well as a maintenance program appointing signal, a common memory appointing signal and a memory starting signal which are delivered from a central processing unit.

BRIEF DESCRIPTION OF THE DRAWINGS

FIG. 1 is a schematic diagram showing the overall configuration of a multi-computer system in accordance with the present invention.

FIG. 2-A. is a schematic circuit diagram of a computer section of the arrangement of FIG. 1.

FIG. 2-B is a block diagram of an embodiment of a central processing unit of the arrangement of FIG. 2-A.

FIG. 2-C is a block diagram of an embodiment of a microprogrammed control unit of the arrangement of FIG. 2-B.

FIG. 2-D and FIG. 2-E are diagrams of respective instruction formats as used in the disclosed system.

FIG. 4 is a schematic circuit diagram of a selector of the arrangement of FIG. 3.

FIG. 9 is a flow chart of the operation of a copy program.

DESCRIPTION OF THE PREFERRED EMBODIMENTS

Figure 3:
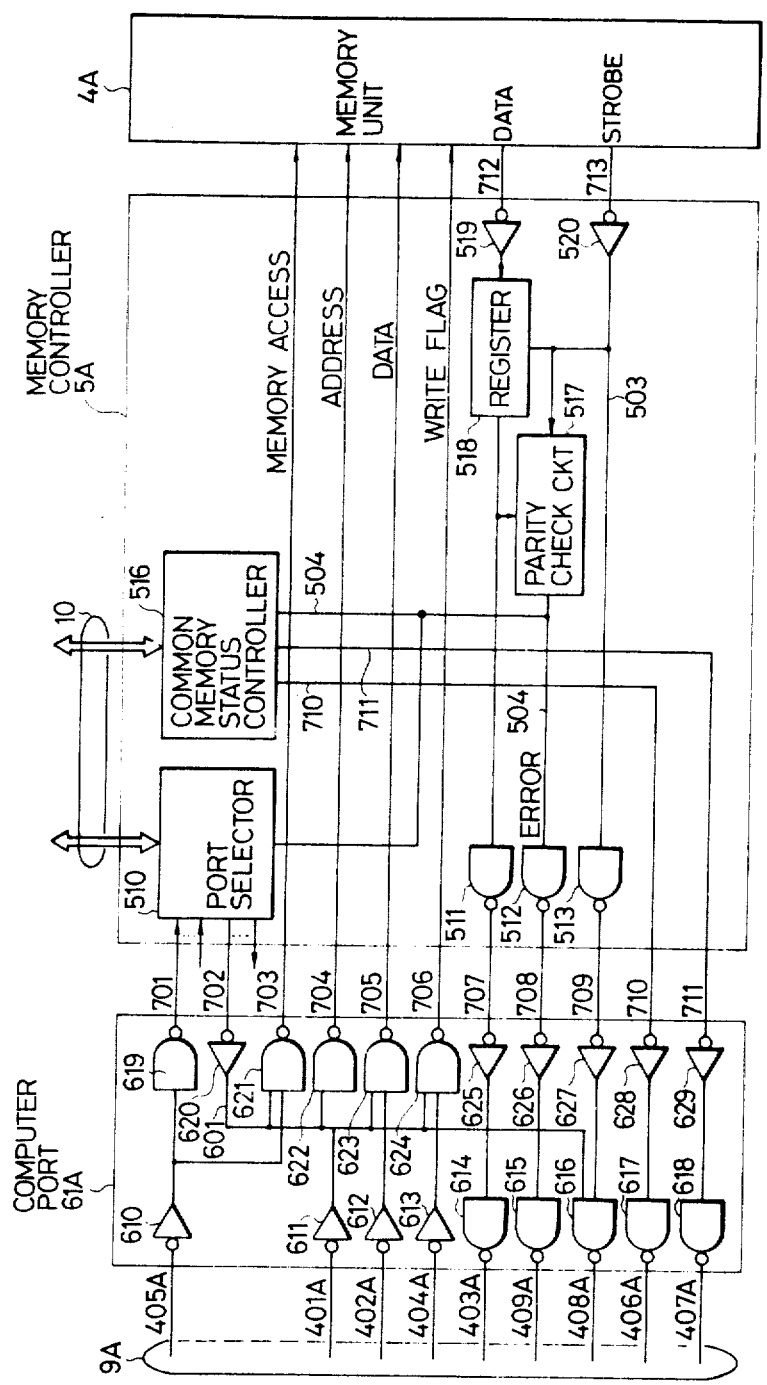
FIG. 3 is a schematic circuit diagram of a common memory section of the arrangement of FIG. 1.

Referring at first to FIG. 1 showing an example of the overall configuration of a multi-computer system in accordance with the present invention, a plurality of computers 1 to 3 are provided with respective central processing units 11 to 13, main memories 21 to 23 and dual memory access units 31 to 33.

Two common memories 7A and 7B are provided in common for the computers 1 to 3, and are adapted to perform Read/Write operations in response to the computers 1 to 3. The common memories 7A and 7B are provided with memory units 4A and 4B, controllers 5A and 5B and computer ports 61A to 63A and 61B to 63B for connection to the computers 1 to 3, respectively. The common memories 7A and 7B are connected to a common memory console 8 by means of an interface 10, while the dual memory access units 31 to 33 are connected to the corresponding computer ports 61A to 63A and 61B to 63B, respectively, through interfaces 9A and 9B.

In the system of the invention, as stated in summary above, memory accesses are made to both memory systems when both of the common memories 7A and 7B are safe. However, when one of the common memories are failed, the computers 1 to 3 perform memory accesses only to the safe common memory. For example, if the common memory 7B fails, access will be made only to the common memory 7A, during the time the usual program is running. However, during the maintenance program mode, memory access is made only to the failed common memory 7B by the computers 1 to 3. The control of such operations is performed mainly by the dual memory access unit in each computer.

Before presenting a more detailed description of a preferred embodiment, it should be understood that the present invention does not involve a special maintenance program of any type, but is applicable to any maintenance program relating to the validity of stored data in a memory. Rather, the invention is directed more particularly to the control necessary to run a selected maintenance program on-line within the multicomputer system, so that access to the failed common memory is effected only while the maintenance program is being run.

FIG. 2-A shows a portion of the computer 1, which exemplifies the computers 1–3, since the other computers 2 and 3 are of the same structure as computer 1.

In the central processing unit 11, there is typically provided a memory address register 110 for holding a memory address of a memory location to which access should be made. During the time a Write order is given a bit "1" is set in a white flag 113, and write data during this state is set in a write data register 111. A bit "0" is set in the flipflop 113 during the time of a Read order. The common memory flag 115 is put to the state "1" when access is to be made to the common memory, while its state is made "0" during an access to the main memory 21. A maintenance flag 114 is adapted to be set to the state "1" during the time a maintenance program is running, but is set to a state "0" during usual operations under the control of other programs.

The memory access from the central processing unit 11 is performed as is usual by a controller 116 in response to the decoding of a particular instruction. The memory request signal from the controller 116 is transmitted to a receiver 316 provided in the dual memory access unit 31, through a driver 123 and a line 207, and is input to a memory access controller 320 as a memory access signal 303. As will be mentioned later, the memory access controller 320 determines to which (or both) common memory 7A, 7B the access should be made. When the access is to be made only to the common memory 7A, only a signal 304 is produced which is delivered to the common memory 7A through a driver 330 and a cable 405A. Similarly, when the access is to be made only to the common memory 7B, only a signal 305 is produced which is delivered to the memory 7B through a driver 331 and a cable 405B. If the access is to be made to each common memory simultaneously, both signals 304 and 305 are output concurrently and are delivered to respective common memories 7A and 7B through the driver 330 and the cable 405A and through the driver 331 and the cable 405B, respectively.

The output from the memory address register 110 is delivered to a receiver 310 in the dual memory access unit 31, through a driver 117 and a line 201, and is then transmitted to the common memories 7A and 7B through a driver 322 and a cable 401A and through a driver 323 and a cable 401B, respectively. The write data from the write data register 111 is delivered to the receiver 311 through a driver 118 and a line 202, and is then transmitted to the common memories 7A and 7B, respectively, through a driver 324 and a cable 402A and through a driver 325 and a cable 402B. The write order (write enable) from the write flag 113 is delivered to a receiver 313, through a driver 120 and a line 204, and is then transmitted to the common memories 7A and 7B, through a driver 328 and a cable 404A and through a driver 329 and a cable 404B, respectively.

FIG. 2-B shows a pertinent part of the central processing unit 11 in FIG. 2-A. The central processing unit 11 consists of an arithmetic and logic unit 1100 which performs the arithmetic and logic operations, an input/output interface unit 1300 which transfers the data between the main memory and input/output devices and/or external storage devices, and a control unit 1200 which controls all of these modules on the basis of instructions fetched from memory. The configurations of these conventional modules are shown, for example, in the publication entitled "microprogramming Handbook" by John R. Mick and Jim Brick which was published in 1976 by Advanced Micro Devices, Inc. A brief explanation of this computer system is given below.

The arithmetic and logic unit 1100 receives the data from the read data register 112 of the I/0 interface unit 1300 through the data bus 1500, and performs operations such as addition, subtraction and logical addition, using the data received and the data stored in a group of data registers (not shown) within the arithmetic and logic unit 1100 itself. Then, the results are transferred to the write data register 111, memory address register 110 or the internal registers of the arithmetic and logic unit 1100. These operations are performed under control of the control unit 1200.

The functions of the microprogrammed control unit 1200 are to fetch instructions via data bus 1500, to decode these instructions, to generate the control signals 1400 which consist of ALU control signals 1208 and microinstruction signals 1209, and to send the ALU control signals 1208 to the arithmetic and logic unit 1100 and to send microinstruction signals 1209 to the I/0 interface unit 1300 in order to execute the instructions which indicate the required data processing procedures to be performed under a given program. Except for the fact that certain instructions call for memory access, the details of these programs are not important to the present invention.

This unit 1200 usually includes a micro-program control, one example of which is shown in FIG. 2-C. As seen in FIG. 2-C, the instruction register 1201 is used for holding the instruction data sent through the data bus 1500. The starting address of the microprograms corresponding to the instruction is read out from the mapping ROM 1201 on the basis of a part of the invention stored in the register 1201. The total sequence of the microprograms is controlled by the microprogram sequence controller 1203 as follows.

The microprograms are read out from the corresponding address of the microprogram ROM 1204 and are set into the pipeline register 1205. The format of the control data stored in the pipeline register 1205 consists of a control signal 1206, which is applied to the microprogram sequence controller 1203, a test and jump address signal 1206 applied to the microprogram sequence controller 1203, ALU control signals 1208 applied to the arithmetic and logic unit 1100, and microinstruction signals 1209 applied to the I/0 interface unit 1300. Again, except for certain bits of the microinstruction signals 1209, the function of the control data stored in the pipeline register 1205 is not relevant to the features of the present invention in the illustrated embodiment.

The I/O interface unit 1300 consists of the interface drivers 117, 118, 120, 121, 122 and 123, the interface receivers 119, 123' and 124, read data register 112, write data register 111, address register 110, write flag 113, maintenance flag 114, common memory flag 115 and the controller 116. The respective registers of the I/0 interface unit 1300 are controlled by the microinstruction signals 1209 derived from the pipeline register 1205. Since this control method is well known, a detailed explanation thereof is omitted; however, the operations of the common memory flag 115 and the maintenance flag 114 will be described in detail, since they have a direct bearing on the operation of the invention.

At first, the common memory flag 115 is used as follows. The common access bit (CMF) in the instruction format, which is shown in FIG. 2-D, is used for the control of the common memory access. If CMF in the instruction is "0", the main memory is referred to rather than the common memory. If CMF is "1", the common memory is referred to. In either case, the effective address (EA), that is, the operand of the instruction, is calculated as follows:

$$EA = (B) + (X) + ADDR$$

Note 1: ( ) indicates the content of the register.
Note 2: OP CODE in FIG. 2-D indicates the instruction code.
Note 3: B indicates the base register.
Note 4: X indicates the index register.
Note 5: CMF indicates the common memory flag.
Note 6: ADDR indicates the memory address which is the address part of the instruction data.
Note 7: MOD indicates the instruction code variation.

This shows that the common memory flag 115 in FIG. 2-C is to be set by the control signal 1212 at the time when the output signal of the AND gate 1213 is delivered. The input signals of the AND gate 1213 are the CMF bit 1210 stored in the instruction register 1201 and the operand fetch control signal 1211 stored in the pipeline register 1205.

On the other hand, the maintenance flag 114 is not required to be switched so dynamically as the common memory flag 115. Therefore, the maintenance flag 114 can be regarded as one of the internal flag registers in the central processing unit. In this case, the maintenance flag 114 is set or reset directly by that instruction which is used for writing data into the internal registers of the CPU, as shown in FIG. 2-E. In FIG. 2-E, OP CODE designates the Store Register instruction and REG ADDR designates the CPU Internal Register A dress, that is, the address of the maintenance flag 114. In FIG. 2-C, the register address signal 1214 of the instruction register 1201 is decoded by the decoder 1215 and the output of the decoder 1215 will be produced when the enable signal 1216 for the external register is delivered from the pipeline register 1205. As a result, the content of the particular bit, for example, the uppermost bits (MSB), from the data bus is set into the maintenance flag 114.

As stated above, the common memory flag 115 and the maintenance flag 114 are controlled by the hardware in the CPU and the decoded intructions. Then, on the basis of the data stored in the common memory flag 115 and the maintenance flag 114, the main memory and the common memory are controlled to achieve the required execution of a memory access under a normal program or a maintenance program in accordance with this invention.

FIG. 3 shows a practical circuit for the computer port 61A, memory controller 5A and the memory unit 4A, as well as the mutual relationship between these portions of the common memory 7A of FIG. 1. The same arrangement is provided for the common memory 7B.

In the computer port 61A, the memory access signal is received by a receiver 610, through the cable 405A of the interface 9A, and a memory access demand 701 is output to a selector 510 of the controller 5A. Memory access demands from respective computers are input to the selector 510, through corresponding computer ports 61A to 63A, and one of them is selected as a selecting signal, for example, on line 702. The arrangement is such that the selector 510 of only one common memory is operated at any given time, while the other common memory receives the selected result through the interface 10, thereby to obtain a synchronized selecting order or sequence, when both of the common memories are safe.

The synchronized selection is necessary for the following reasons. Let us assume that a write operation to both of the common memories 7A and 7B is activated by CPU1 and simultaneously a read operation is requested by CPU2. If the selector 510 of the common memory 7A selects CPU1 and thereafter selects CPU2, and the selector 510 of the other common memory 7B selects CPU2 and thereafter selects CPU1, there is a possibility that the read out data received in CPU2 from the common memories 7A and 7B on the data lines 403A and 403B of interfaces 9A and 9B, respectively, will be different. In addition, in the case where both the CPU1 and the CPU2 achieve a write operation, the result of an unsynchronized selection is that the content of the accessed address may differ between the common memories 7A and 7B. These results stated above are unacceptable for dualized memory operation. Therefore, in the case where both memories are safe, the possibility that the two selectors 510 may select an access request 701 independently should be avoided. For this reason, the synchronized selection has to be adapted as follows.

(A) In case of dual operation, one of the common memories, that is, a master memory, has the right of selection of the CPU request, and sends the result of selection to the other, which acts in this case as a slave memory through the interface 10. The selector 510 of the slave memory should not select its request lines 701, and should transmit the selection signals 702 solely on the basis of the selection result of the master memory.

(B) In case where one common memory is normal, and the other has failed, both of the common memories 7A and 7B are placed under independent operation from each other. The two selectors 510 in both common memories operate to achieve independent selection.

In FIG. 4, one example of the selector 510 is shown. The plural request signals 701 from one or more CPUs are provided as input signals to a priority encoder 2030, which provides an output for selecting one of the requests. For this purpose, any known priority selection method may be employed. The output of the priority encoder 2030 is applied as the input of a selector circuit 2110 and is to be sent to the other common memory through interface lines 2100, forming part of the bus 10 to the other common memory and from which similar selection data may be received through the interface lines 2090. The selector circuit 2110 selects the one of selection results, that is, the output of the priority encoder 2030 or the selection data or interface lines 2090 in response to the signal 2080 from the output of AND gate 2070, indicating the controlled dualized common memory status.

At first, a master/slave relationship between the common memories is to be indicated at a master status flag 2050. In this regard, the master status flag 2050 may be automatically set in one of the common memories at the time of initialization of the system or may be selected from the console. Let us assume that the error signals 711 of both the common memories indicate no error and the common memory 7A is not the master according to the state of the master status flag 2050. The output signal 2080 of the AND gate 2070 in the common memory 7A will be high in this case. That makes the selector 2110 select the selection signals received on interface 2090 from the other common memory 7B in which the priority selection is made. In other cases, the selection signals of the internal priority encoder 2030 will be selected as the selection signals 702. That is, in the following cases, independent selection is to be achieved. The first case is where the common memory 7A is the master common memory according to the state of the master status flag 2050 therein. The second case is where at least one of the common memories has at least one error so that the output of AND gate 2060 is low. The AND gate 2060 receives at one of its inverting inputs the error signal on line 504 from the internal parity check circuit 517, and this error signals is also forwarded to the other memory controller 5B via bus 10. The other inverting input to AND gate 2060 receives the error signal forwarded from the other memory controller 5B. Of course, the same result occurs when both of the common memories have at least one error, since AND gate 2060 will have its output low if either or both inputs are high.

In the computer port 61A selected as above, drivers 621 to 624 are opened by a signal 601 transmitted through a receiver 620 from the output 702 of the port selector 510. Therefore, the memory address transmitted through the cable 401A is transferred to a line 704 through receiver 611 and a driver 622, while the write data transmitted through the cable 402A is transferred to a line 705 through a receiver 612 and a driver 623. The write flag transmitted through the cable 404A is transferred to a line 706 through a receiver 613 and a driver 624. The memory access signal transmitted through the cable 405A is also output to a line 703, through the receiver 610 and the driver 621, so as to actuate the memory unit 4A to perform the writing of the data in the memory unit 4A.

The data unit for the write data operation to the common memory is performed as explained above, whereas the following functions are performed for the read data operation. Referring to FIG. 3, read data is output from a designated address location in the memory unit 4A to a line 712 and a strobe timing signal is applied on a line 713 when a memory access request is received on line 703 and a memory address is received on line 704 in the absence of a write flag on line 706. In the memory controller 5A, the read data received through a receiver 519 is set in a register 518, by means of the strobe timing signal applied to line 503 via receiver 520. The content of the register 518 is delivered to the computer 1 through a driver 511, line 707, receiver 625, driver 614 and then a cable 403A, and meanwhile, is checked by the parity check circuit 517. When an error is detected, an error signal on line 504 is delivered to the computer 1 through a driver 512, line 708, receiver 626, driver 615 and then a cable 409A, and at the same time, to a common memory status controller 516 as well as to the port selector 510. When the controller 516 receives the error signal on line 504, a status signal representing the status of the memory unit 4A is changed from safe to fail.

Figure 7:
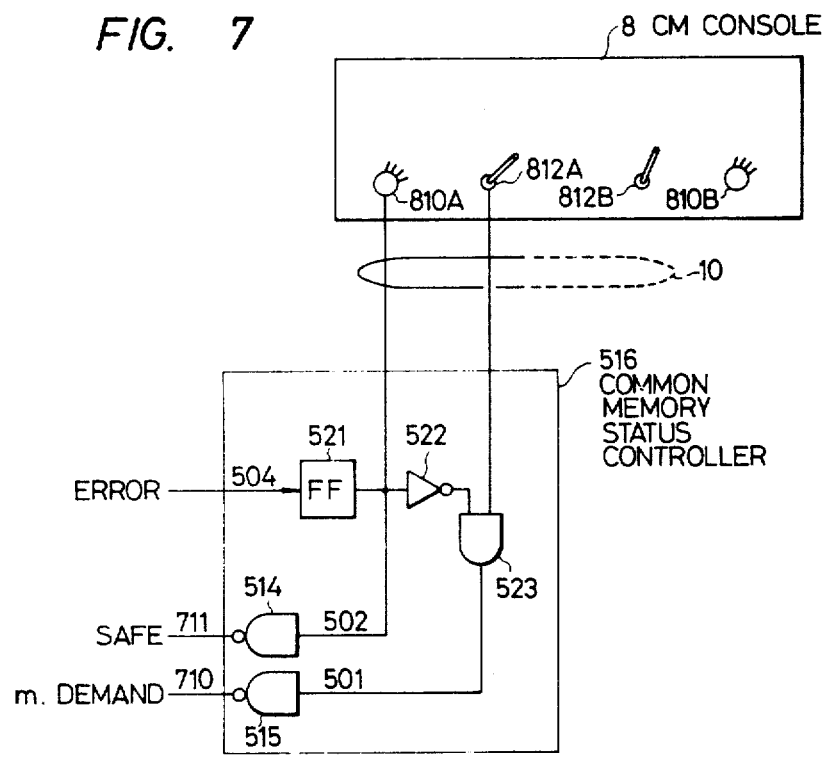
FIG. 7 is a schematic diagram showing a practical example of a part of the circuit of FIG. 3.

As will be seen from FIG. 7, the common memory status controller 516 has a flag (flip-flop) 521 adapted to express whether the memory unit 4A is safe or not. Codes "1" and "0" are set in the flip-flop 521, in case of safe and fail status conditions in the common memory, respectively. The flag 521 as a signal 502 is delivered to a receiver 334 of the dual memory access unit 31 through a driver 514, line 711, a receiver 629 in the computer port 61A, driver 618 and then a cable 407A, and is received by the memory access controller 320, as a "safe" signal 308. On the other hand, when the flag 521 is in the "0" state, a corresponding indication lamp 810A in the common memory console 8 is energized to indicate the failure condition. The operator then operates a maintenance demand appointing switch 812A in the console 8, so as to change the corresponding common memory 7A into the state of maintenance demanding.

When the flag 521 is representing a failure, i.e., when in the "0" state, the output from the NOT gate 522 becomes "1", so that the signal from the switch 812A is transmitted through driver 515 and line 710 to a receiver 332 of the dual memory access unit 31, and then is received by the memory access controller 320 as a maintenance demand signal 306. The status of the common memory, i.e., whether safe or not, and, if not, whether in the state of maintenance demanding or not, is received by the memory access controller 320 of the dual memory access unit of each computer.

Also, in FIG. 7, 810B denotes an indication lamp for indicating a failure of the memory unit 4B, while 812B denotes a maintenance demand appointing switch for the memory unit 4B.

Returning to FIG. 3, the strobe timing signal 503 is transmitted to a receiver 627 of the computer port 61A through a driver 513 and a line 709, and is delivered to the computer corresponding to the port, i.e., the computer 1, through the enabled driver 616 and a cable 408A. It will be clear to those skilled in the art that the timing signal 503 is delivered to another computer, e.g., the computer 2, when the selector 510 selects the corresponding computer port, e.g., the port 62A. As will be seen from FIG. 2-A, the dual memory access unit 31 receives the strobe timing signals corresponding to the read data from the common memories 7A and 7B, through a cable 408A and a receiver 336, and through a cable 408B and a receiver 337, respectively. Similarly, error signals are received through a cable 409A and a receiver 338, and through a cable 409B and a receiver 339, respectively.

Figure 5:
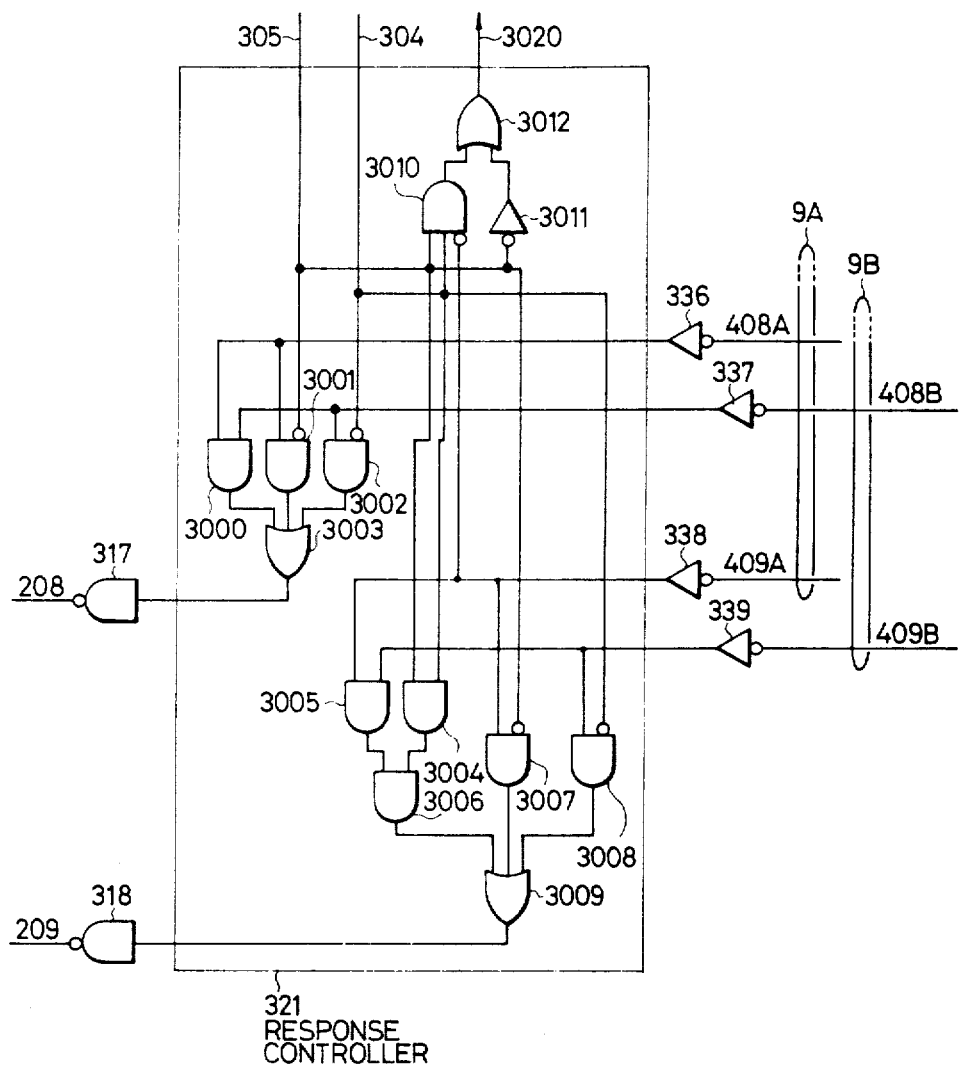
FIG. 5 is a schematic circuit diagram of a response controller of the arrangement of FIG. 2-A.

A response controller 321 is adapted to control the selector 319 to determine which one of the data received via cables 403A or 403B should be selected for insertion into the read data register 112, and also the response controller 321 generates a strobe signal 208 and an error signal 209 to the CPU 11, upon receiving the strobe timing signals on cables 408A and 408B, and the error signals on cables 409A and 409B from the common memories 7A and 7B which accept the request of memory access. FIG. 5 indicates an example of the response controller 321. The strobe signal 208 to the CPU 11 is to be generated at the output of NAND gate 317 in the following manner according to the operation conditions.

(a) In the case where the CPU sends a memory request to both of the common memories 7A and 7B, the strobe signal 208 is outputted when both of the strobe timing signals on cables 408A and 408B are received from the two common memories. At this time, AND gate 3000 or OR gate 3003 produce the strobe signal on line 208.

(b) In the case where the CPU sends a request only to the common memory 7A, the memory access controller 320 outputs signals on lines 304 and 305 indicating which common memory has been accessed. These signals are generated easily in response to signals on the three input signal lines 301, 302 and 303 to the access controller 320, as will be described later with reference to FIG. 6. In this case, the request signal 305 has not been sent to the common memory 7B. Thus, the strobe signal 208 is received through an INHIBIT gate 3001 and the OR gate 3003, when the strobe timing signal on cable 408A reaches the response controller 321, without waiting for the strobe timing signal on cable 408B, which is not expected.

(c) In the case where the CPU sends a memory request only to the common memory 7B, the same control mechanism operates to send a strobe signal 208, when the strobe timing signal on cable 408B reaches the response controller 321. In this case, the strobe signal 208 is generated through an INHIBIT gate 3002 and the OR gate 3003.

In the same way, the error signal 209 to the CPU 11 and a control signal 3020 for the selector 319 are generated as follows, according to the operation conditions.

(a) In the case where the CPU sends a memory request to both of the common memories 7A and 7B, the error signal on line 209 is received through AND gates 3004, 3005 and 3006 and an OR gate 3009, only when both error signals on cables 409A and 409B from the common memories 7A and 7B, respectively, are received as inputs to the response controller 321 and the signals on lines 304 and 305 indicate that a memory request has been sent to both common memories. Under this condition an interrupt will be generated by the controller 116 to indicate that the received data should be ignored. On the other hand, if only one of the two common memories generates an error signal, no error signal will appear on line 209, but the control signal 3020 will ensure that data is placed in the read data register 112 only from the safe memory. In this regard, the control signal 3020 controls the selector 309 to send the data on cable 403A from the common memory 7A to the CPU 11 under the condition than an error signal on cable 409A from the common memory 7A is not received in the response controller 321. This condition is detected through an INHIBIT gate 3010 and an OR gate 3012. If an error signal is received on cable 409A, gate 3010 is blocked and the control signal 3020 will select the data on cable 403B.

(b) In the case where the CPU sends a memory request only to the common memory 7A, an error signal on line 209 is received through an INHIBIT gate 3007 and the OR gate 3009, only when an error signal on cable 409A from the common memory 7A is received in the response controller 321 and the signal on line 305 indicates that no memory request was sent to common memory 7B. Under these conditions, the control signal 3020 selecting the data on cable 403A is always generated through a NOT gate 3011 and OR gate 3012, because the request signal 305 to the common memory 7B has not been sent.

(c) In the case where the CPU sends a request only to the common memory 7B, the error signal on line 209 is generated through an INHIBIT gate 3008 and the OR gate 3009, only when the error signal 409B from the common memory 7B reaches the response controller 321 and the signal on line 304 indicates that no memory request was sent to the common memory 7A. The control signal 3020 is always in the low state in this case so as to select the data on cable 403B from the control memory 7B.

The controller 116 in FIG. 2-C consists of a flip-flop 1221, which will be set by a memory request (MREQ) signal 1220 in the microinstruction signal 1209 from the pipeline register 1205, and a memory error interrupt flag 1222, which will be set by the strobe timing signal 208 on condition that the error signal 209 is on. If the flip-flop 1221 is set, the request signal 207 for the memory access is sent to memory access controller 320 in the dual memory access unit 31, and a timing wait signal 1223 is outputted. This signal 1223 will be used as a synchronization signal between the CPU and the common memory by a timing controller in the CPU, not illustrated in FIG. 2-C. The flip-flop 1221 is reset, when the strobe timing signal 208 is received from the response controller 321, so as to restart the CPU 11. The memory error interrupt flag 1222, the output of which is an interruption signal sent to the CPU 11 where it is detected by the operating system software so as to print out alarm messages for requiring maintenance action and perform other functions as required by this condition, is set in response to an error signal on line 209.

An explanation will be made hereinafter as to the memory access controller 320 in the dual memory access 31, with specific reference to FIGS. 2A and 6.

In FIG. 2-A, the cable 407B corresponds to the memory unit 4B, and the cable 407A corresponds to the memory unit 4A. Therefore, the output 308 from the receiver 334 represents whether the unit 4A is safe or not, while the output 306 from the receiver 332 represents whether the memory unit 4A is demanding maintenance. Similarly, the output 309 from the receiver 335 represents whether the unit 4B is safe or not, while the output 307 from the receiver 333 represents whether the memory unit 4B is demanding maintenance.

As shown in FIG. 20A, a maintenance flag 114 in the central processing unit 11 of the computer 1 is provided for representing that the program now run by the computer is the maintenance program. The flag is delivered as a maintenance demand appointing program signal 301 to the memory access controller 320, through a driver 121, line 205 and receiver 314. A common memory flag 115 representing the common memory access is delivered as a common memory access appointing signal 302 to the memory access controller 320 through a driver 122, line 206, and a receiver 315, while a memory access signal 303 is delivered from the controller 116 to the memory access controller 320 through a driver 123, line 207 and a receiver 316. These two signals 302 and 303 together indicate that a memory access is requested involving the common memory.

The memory access controller 320 determines which (or whether both) of the common memories are to be accessed. This selection is effected in response to a maintenance program signal on line 301 from the central processor unit 11, the common memory access appointing signal 302 and the memory access signal 303, which are also received from the central processor unit 11, as well as status signals 308 and 309 representing whether the respective common memory is safe or not, and maintenance demand signals 306 and 307, which are delivered from respective common memories.

Figure 6:
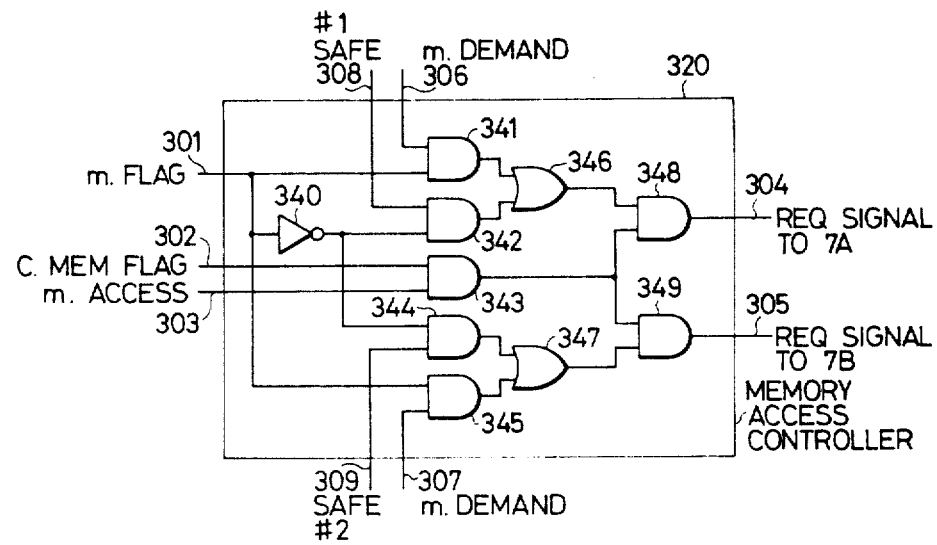
FIG. 6 is a schematic circuit diagram of a memory access controller of the type provided in the circuit of FIG. 2-A.

FIG. 6 shows a practical example of a circuit for the memory access controller 320. The output from the AND gate 343 becomes "1", when both of the memory access signal 303 and the common memory access appointing signal 302 are "1". In this state, if the maintenance program appointing signal 301 is "1", and there exists a maintenance demand signal 306 (307) for the common memory 7A (7B), the outputs of the AND gate 341 (345) and the OR gate 346 (347) are "1", respectively, and the starting signal 304 (305) for the common memory 7A (7B) becomes "1" through the AND gate 348 (349). The maintenance demand signal 306 (307) is generated by the operator by means of the switches 812A and 812B, and so, he must not turn both of them to "1" simultaneously.

In contrast, when a normal or usual program is initiated, i.e., when the maintenance program signal 301 is "0", the starting signals 304 and 305 are turned to "1" through NOT gate 340, AND gate 342, AND gate 344, OR gates 346 and 347, and AND gates 348 and 349, if signals 308 and 309 for the common memories 7A and 7B indicate that both memories are in a safe condition, thereby to start both of the common memories 7A and 7B. On the other hand, when the memory access signal 303 and the common memory appointing signal 302 are both "1", with the program being the maintenance program, the access is made only to the common memory demanding the maintenance by the memory access controller 320, whereas no access is made to the safe common memory. However, during running of the normal program, the access is made only to the safe common memory and not to the failed common memory.

The procedure for the maintenance in the described embodiment can be summarized as follows. It is assumed here that a parity error has just taken place in the common memory 7A which had been operated safely, resulting in the failure of the common memory 7A.

(1) The indicator lamp 810A comes on in the common memory console 8, to inform the operator of a failure in the common memory 7A.

(2) The operator operates the maintenance appointing switch 812A to inform the memory access controller 320 of a maintenance demand, and orders a selected (or predetermined) computer to perform a maintenance program.

(3) The computer having received the order then performs the maintenance program, in accordance with a predetermined priority, excluding the on-line task now being performed.

The maintenance program may be designed for checking the contents of the memory by way of, for example, writing certain data into the entire common memory, reading out the data, and then comparing the written data and the data which has been read out. However, it is necessary to check the data of the common memory which is to be checked, without any interference with the normally operating common memory which is usually used for on line data storage. For this purpose, in the maintenance program, the set instruction of the maintenance flag 114 has to be executed before the Read/Write operations of the common memory. If the maintenance flag is on, the Read/Write operations of the common memory are effective only for the common memory which is required to be checked and are not effective for the normal operating common memory.

Figure 8:
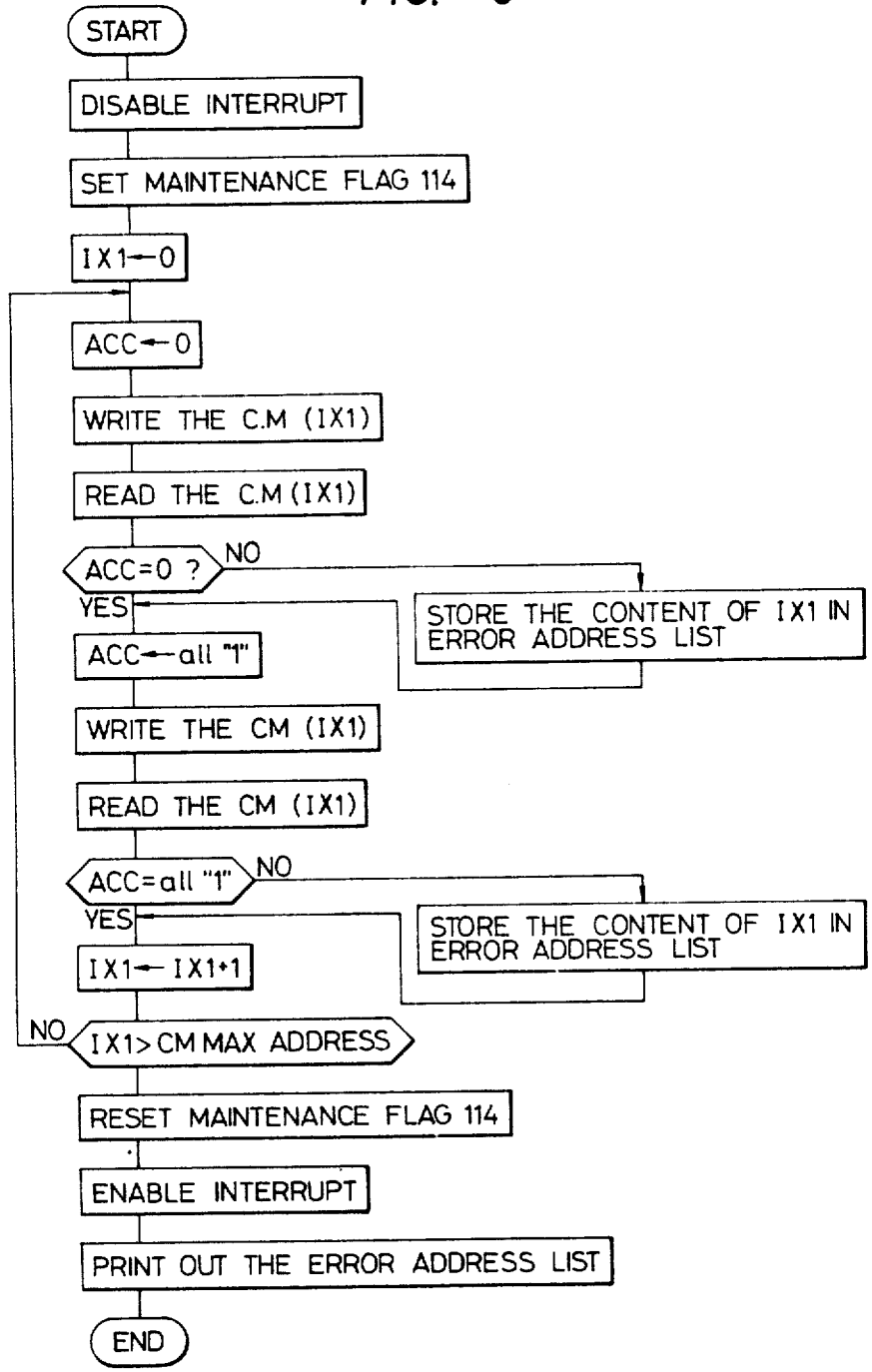
FIG. 8 is a flow chart of the operation of an on-line maintenance program.

While the maintenance program does not form a specific feature of the present invention, a simple example of an on-line maintenance program flow chart is shown in FIG. 8. The maintenance flag 114 is programmable, so as to be set and reset by instructions used in the flow chart. IX1 is an index register and ACC is an accumulator, which are common in a conventional computer. CM (IX1) means the storage location in the common memory which is designated by the content of IX1. When a write operation is executed, the content of the ACC is sent to the location in the common memory. On the other hand, when a read operation is executed, the content of the location designated by the IX is to be sent to the ACC. It is possible to check the common memory by comparing the content of the ACC with the data written beforehand. If there is some difference between the read-out data and the written data, the address has to be an error address. The printed list of error addresses is useful for maintenance action.

(5) The operation then repeats steps (2) and (3) to confirm that the trouble has been corrected completely.

(6) When complete recovery is confirmed, the operation orders a copying operation, making the content of the failed common memory 7A coincide with that of the safe one 7B, to initiate once again the dual operation of the system.

The words "Copying Operation" are used to refer to an operation for making the content of the previously failed memory system coincide with that of the safe memory system now performing the on-line task, and can be performed completely by hardware or may be treated by software. One example of hardware mechanism is described in U.S. Pat. No. 3,866,182 issued Feb. 11, 1975, entitled "System for Transferring Information Between Memory Banks", Yamada et al assigned to Fujitsu Limited. FIG. 9 shows one simple example of the copying operation implemented in software. In FIG. 9, the portion A is intended to prevent disturbance for the copying operation by inhibiting the other CPUs from obtaining access to the common memory. The portion B is to execute a read operation of the normal common memory, and the portion C is to execute a write operation of the repaired common memory.

It will be understood from the foregoing description that the maintenance can be performed without separating the failed common memory from the line, making use of a maintenance program prepared in the computer which is on line. At the same time, the memory system of the dual common memory can be checked in the on-line state by a program, promising a remarkably shortened maintenance time and a consequent improvement in the reliability of the dual common memory. In addition, specific maintenance apparatus can be dispensed with.

While we have shown and described several embodiments in accordance with the present invention, it is understood that the same is not limited thereto but is susceptible of numerous changes and modifications as known to those skilled in the art, and we do not wish to be limited to the details shown and described herein but intend to cover all such changes and modifications as are encompassed by the scope of the appended claims.

What is claimed is:

1. A multi-computer system comprising a plurality of computers each of which has a central processing unit and a dual memory access unit; at least two common memories; interface means for connecting the dual memory access units in all of said computers to each of said common memories; and maintenance demand appointing means connected to said common memories for providing a maintenance demand signal to the dual memory access unit in at least one of said computers when an error occurs in connection with a memory access; at least one of the central processing units including maintenance flag means for producing a maintenance program appointing signal when a maintenance program is to be executed in this central processing unit and each of said common memories having at least one status means for producing a status signal representing whether or not the common memory is in a normal operating condition; said dual memory access unit in each central processing unit including means responsive to said maintenance program appointing signal for restricting access by that central processing unit to the common memory selected by said maintenance demand signal and identified by a status signal representing that the common memory is not in a normal operating condition for executing a maintenance program in connection with that common memory.

2. A multi-computer system comprising a plurality of computers each of which has a central processing unit, a main memory and a dual memory access unit; at least two common memories each of which has a memory unit, a memory controller and a plurality of computer ports each corresponding to one of said plurality of computers; interface means for connecting respective computer ports to said dual memory access units of the corresponding computers; and maintenance demand appointing means for providing maintenance demand signals for the respective common memories; at least one of said central processing units having maintenance flag means for producing a maintenance program appointing signal when a maintenance program is to be executed in this central processing unit and common memory flag means for producing a common memory appointing signal when the contents of the common memory are required to be read or when data is to be written therein; said memory controller for each common memory having at least status means for producing a status signal representing that the memory unit is not in a normal operating condition; and said dual memory access unit in each central processing unit including means responsive to said maintenance program appointing signal for restricting access by a central processing unit to a common memory which is determined by the common memory appointing signal, maintenance demand signal and the status signal representing that the common memory is not in a normal operating condition for executing a maintenance program in connection with that common memory.

3. A multi-computer system according to claim 2, wherein each memory controller includes register means for storing data received from the associated memory unit, means for applying the data in said register means to a given computer via the associated computer port, and parity check means for checking the parity of the data in said register means and for generating said status signal.

4. A multi-computer system according to claim 3, wherein said maintenance demand appointing means includes indicator means responsive to an error signal for providing a visual indication of a detected error and manually operated switch means for generating a maintenance demand signal.

5. A multi-computer system according to claim 4, wherein each memory controller includes memory status controller means responsive to an error signal for applying a maintenance demand signal generated by said switch means through a computer port to the associated computer.

6. A multi-computer system according to claim 2, wherein said maintenance demand appointing means includes memory status controller means responsive to an error signal from a memory controller for applying a maintenance demand signal through a computer port to a selected computer.

7. A multi-computer system according to claim 2, wherein said memory access controller means includes means for generating first and second enabling signals individually or simultaneously for enabling a computer port of one or both of said common memories in response to the signals applied to said memory access controller means.

* * * * *